United States Patent
Takeyari

[11] Patent Number: 5,844,445
[45] Date of Patent: Dec. 1, 1998

[54] FEEDBACK TYPE PRE-AMPLIFIER

[75] Inventor: Ryoji Takeyari, Koganei, Japan

[73] Assignee: Hitachi, Ltd., Tokyo, Japan

[21] Appl. No.: 736,209

[22] Filed: Oct. 25, 1996

[30] Foreign Application Priority Data

Oct. 27, 1995 [JP] Japan ................................... 7-280153

[51] Int. Cl.⁶ ............................... H03F 1/32; H03F 17/00
[52] U.S. Cl. ..................... 330/293; 250/214 A; 330/308; 359/189
[58] Field of Search ............................. 330/59, 288, 293, 330/308; 250/214 A, 214 AG; 359/189, 194

[56] References Cited

U.S. PATENT DOCUMENTS

| | | | |
|---|---|---|---|
| 3,996,462 | 12/1976 | Fletcher et al. | 330/59 X |
| 4,065,668 | 12/1977 | Monticelli | 330/288 X |
| 4,467,289 | 8/1984 | Okada | 330/288 |
| 5,307,023 | 4/1994 | Schade, Jr. | 330/288 |

OTHER PUBLICATIONS

FETs as described in the proceeding of the 1992 IEICE fall conference, B979.
Proceeding of the 1992 IEICE general conference, B–1165.

*Primary Examiner*—James B. Mullins
*Attorney, Agent, or Firm*—Antonelli, Terry, Stout & Kraus, LLP

[57] ABSTRACT

A pre-amplifier disclosed in which low noise at the time of small input and linear amplification at the time of large input are compatible. In a pre-amplifier, such compatibility can be realized by constituting a current mirror circuit, with respect to a current of a first stage transistor in a transimpedance portion, by a by-passing transistor which is provided at an input side of the pre-amplifier. In such a configuration, by making a by-pass current flow proportionally to an input instantaneous current at the time of a large input, the transimpedance can be made small equivalently to thereby widen the dynamic range.

16 Claims, 6 Drawing Sheets

FEEDBACK TYPE PRE-AMPLIFIER

BACKGROUND OF THE INVENTION

The present invention relates to pre-amplifiers, particularly to a pre-amplifier for amplifying a current signal which is converted from an optical signal by means of a photodiode, and more particularly to a feedback type pre-amplifier which is called a transimpedance type pre-amplifier.

In optical transmission schemes presently in use in public telecommunication networks, it is necessary to provide a function to convert a weak optical signal into an electric signal on a reception side. To provide such a function, it is a general practice to use a photodiode and a low-noise pre-amplifier.

Figure 8:
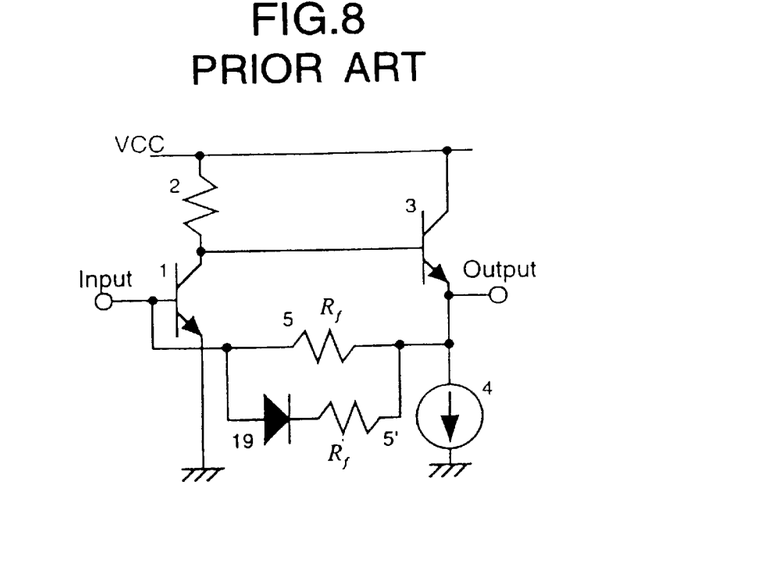
FIG. 8 is a diagram showing a conventional wide dynamic range pre-amplifier using bipolar transistors.

A transimpedance type pre-amplifier is a pre-amplifier of the type in which, as shown in FIG. 8, an output of an inverting amplifier is connected to an input of the same amplifier through a feedback resistor 5. In a pre-amplifier of this type, since noise is inversely proportional to the resistance value of the feedback resistor 5, one would seek to make the sensitivity of the pre-amplifier high by making the resistance value of the feedback resistor 5 high.

In an actual optical transmission system, however, having a high sensitivity alone will not make the system practical. The transmission losses of networks are not constant because the transmission lengths/destinations associated with different networks are different from each other and this difference is in accordance with the physical architectures of the respective networks. Further, there is a scattering in output power of an optical transmitter and losses of optical fibers forming optical transmission paths. Accordingly, power of received light is not always constant and it is, therefore, required for an optical receiver to receive light power in a certain range. The wider the range of received light power, that is, the wider the dynamic range, the wider the range of application of the optical receiver. Further, if the dynamic range is wide, it is possible to cope with changes in the received light power due to deterioration with age.

Though high sensitivity can be realized by making the feedback resistance of the pre-amplifier high as described above, the high feedback resistance does not always cause widening of the dynamic range. The output voltage of a transimpedance type pre-amplifier has a value which is a product of the value of the input current and the resistance value of the feedback resistor. When the input optical signal is large, the voltage by the feedback resistor correspondingly drops by a large amount and the circuit becomes saturated. Generally, since the circuit saturation amplitude of a pre-amplifier depends on applied electronic devices which are determined in accordance with the operation speed of the pre-amplifier, it may be considered that the saturation amplitude is substantially constant so long as the operation speed is not changed. Accordingly, if the resistance value of the feedback resistor is made high to make the sensitivity high, the input amplitude which does not make the circuit saturate becomes small reverse-proportionally. In a transimpedance type pre-amplifier using resistance feedback, therefore, it is difficult to realize compatibility of high sensitivity and wide dynamic range.

As a typical method of widening the dynamic range in a transimpedance type pre-amplifier, there are proposals of a circuit configuration which is adapted to FETs as described in the proceeding of the 1992 IEICE fall conference, B-979, and a circuit configuration which is adapted to bipolar transistors as described in the proceeding of the 1992 IEICE general conference, B-1165.

Figure 7:
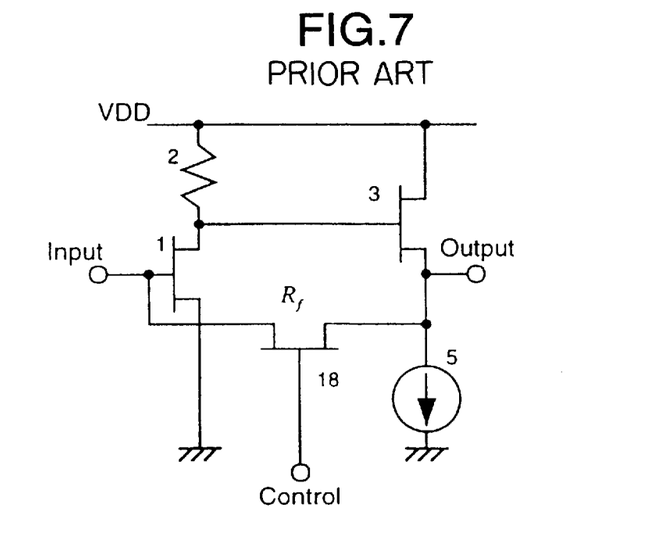
FIG. 7 is a diagram showing a conventional wide dynamic range pre-amplifier using FETS.

FIG. 7 shows a circuit in the case where FETs are used as the electronic devices. In this circuit, the feedback resistor is constituted by the drain-source resistance of an FET 18 and the resistance value of the feedback resistor is changed by controlling the gate potential of the FET 18. When the received light power is small, high sensitivity can be realized by making the drain-source resistance of the feedback resistor high, whereas when the received light power is large the circuit saturation can be avoided by making the drain-source resistance of the feedback resistor low.

FIG. 8 shows a circuit using bipolar transistors which are on the mainstream of the electronic devices. Since this circuit can be produced by use of Si without using a compound semiconductor used for high speed FETs, it is advantageous in view of yield and cost. This is a method in which a diode 19 and a low resistance series resistor 5' are connected to the feedback resistor 5 in parallel thereto so that the effective resistance value of the feedback resistor is made small when the input is large to thereby avoid the saturation of the circuit.

Figure 9:
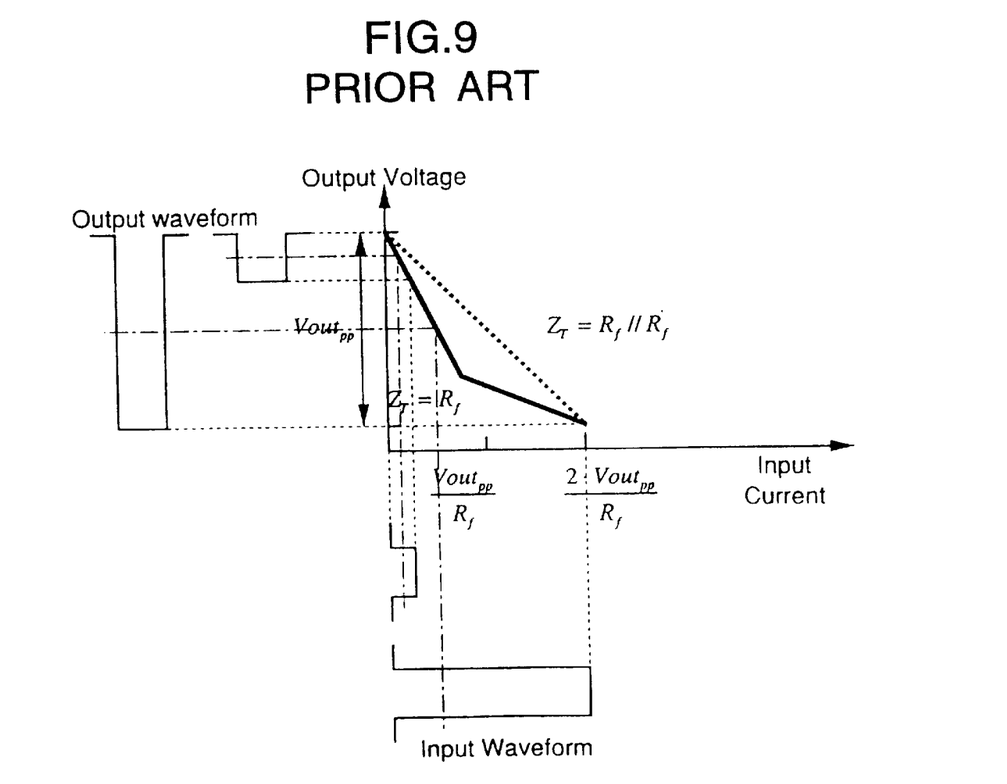
FIG. 9 is a diagram showing an input-output characteristic of the conventional bipolar wide dynamic range pre-amplifier.

FIG. 9 shows the input-output characteristic of the circuit shown in FIG. 8. When the input current is small, the diode 19 is off so that the input current flows only in the feedback resistor 5. Accordingly, the transimpedance is equal to the resistance value of the feedback resistor 5. When the input current becomes large so that the voltage generated across the feedback resistor 5 exceeds the ON-voltage of the diode 19, the input current flows in both the feedback resistor 5 and the feedback resistor 5' connected in series to the diode 19, and the transimpedance becomes equal to the parallel resistance value of the feedback resistor 5 and the feedback resistor 5'. Thus, the average transimpedance at the time of large input can be made low.

In such a circuit using bipolar transistors as shown in FIG. 8, however, there is a problem that the degree of improvement of the dynamic range is small.

In FIG. 9, the input current waveform is shown in the axis of abscissa and the output voltage waveform is shown in the axis of ordinates. When the input amplitude is small, linear amplification is carried out so that the center of level of the output waveform corresponds to the center of level of the input waveform, whereas when the input amplitude becomes large, the transfer characteristic becomes a polygonal line so that the center of level of the output waveform corresponds to the level at a position lower than the center of level of the input waveform. Since the waveform amplified by a pre-amplifier has an analog value, it is necessary, in a receiver, to perform logical judgment at a discrimination level in a stage after the pre-amplifier. Since the threshold value for the logical judgment is set to a center of a pulse, the probability of data error due to inter-symbol interference of the input waveform is high under the transfer characteristic of FIG. 9. In the circuit shown in FIG. 8, accordingly, there is a limit in enlargement of the input dynamic range with respect to an input waveform in which inter-symbol interference is large, and it is considered that the degree of improvement in enlargement of the dynamic range is about 6 dB.

SUMMARY OF THE INVENTION

It is an object of the present invention to provide a pre-amplifier which is high in sensitivity and wide in dynamic range.

In order to achieve the above object, according to an aspect of the present invention, a pre-amplifier comprises: input means for receiving a current signal; amplifying means including a transistor for amplifying the received current signal; a control current source connected to the input means for controlling the received current signal; and current detecting means connected to an inside of the amplifying means, that is, as a component thereof, whereby the control current source is controlled by the current detecting means.

In the pre-amplifier according to the present invention, the current detecting means includes a diode connected in series to an emitter of the transistor, and the control current source and the diode constitute a current mirror circuit.

The pre-amplifier according to the present invention further comprises a first current source connected to the current detecting means in parallel thereto or a second current source connected to the control current source in series thereto.

According to another aspect of the present invention, a pre-amplifier comprises: input means for receiving a current signal; amplifying means including at least one transistor for amplifying the received current signal; current detecting means connected to an inside of the amplifying means; a control current source connected to the input means, the control current source being controlled by the current detecting means; and a current dividing circuit connected to the control current source, at least one output of the current dividing circuit being connected to an input of the pre-amplifier.

In the pre-amplifier according to the present invention, the current dividing circuit is controlled by an average output voltage of the pre-amplifier.

According to a further aspect of the present invention, an optical receiver is constituted by the above-mentioned pre-amplifier and control means connected to the pre-amplifier for controlling a current distribution ratio of the pre-amplifier in correspondence to power the of an optical signal inputted to the pre-amplifier.

In the aforementioned pre-amplifier according to the present invention, a control current source is connected parallelly to an input terminal for by-passing an excessive current, and a current mirror circuit is constituted, with respect to the current flowing in the first stage transistor of a transimpedance portion, by using the above-mentioned control current source and a diode which is a current detecting means, so that it is possible to change the by-pass current in accordance with the current waveform of the input signal. Further, by dividing the current flowing in the by-pass transistor, the ratio of the by-pass current can be changed to thereby change the transimpedance.

BRIEF DESCRIPTION OF THE INVENTION

DETAILED DESCRIPTION OF THE PREFERRED EMBODIMENTS

Figure 1:
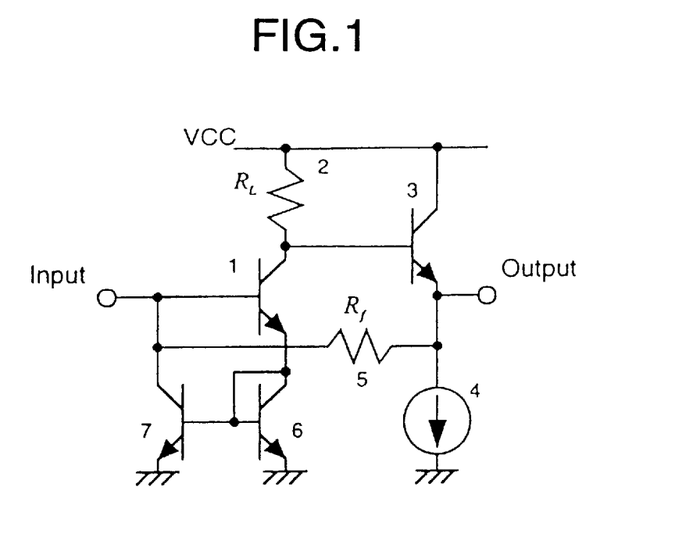
FIG. 1 is a diagram showing a basic circuit according to an embodiment of the present invention.

FIG. 1 shows the most basic circuit configuration of a transimpedance type pre-amplifier according to the present invention. A first stage amplifier circuit is constituted by a transistor 1 and a load resistor 2 and an output is fed back to an input through an emitter follower transistor 3 and a feedback resistor 5. The circuit thus mentioned above is an ordinary transimpedance circuit and a transistor 7 is a current by-pass transistor. The base of this transistor 7 and a diode 6 are connected to constitute a current mirror circuit.

When the current of the feedback resistor 5 and the first stage by-pass current are represented by $i_f$ and $i_{by-pass}$ respectively, the current of the transistor 7 is expressed by the following expression 1:

$$\frac{R_f}{R_L} i_f + i_{by-pass} \tag{1}$$

Here, if the input current is represented by $i_{in}$ and the ratio between the diode 6 and the by-pass transistor 7 is represented by k, the by-pass transistor 7 by-passes the current having a value expressed by the following expression 2:

$$k\frac{\frac{R_f}{R_L} i_{in} + i_{by-pass}}{k\frac{R_f}{R_L} + 1} \tag{2}$$

Accordingly, the current which flows in the feedback resistor 5 takes a value expressed by the following expression 3:

$$\frac{i_{in} - k i_{by-pass}}{k\frac{R_f}{R_L} + 1} \tag{3}$$

Figure 2A:
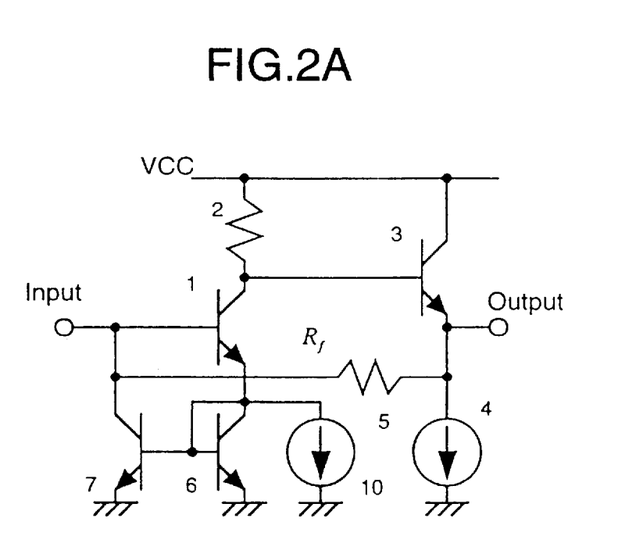
FIGS. 2A and 2B are diagrams showing circuits for canceling a first stage by-pass current.
Figure 2B:
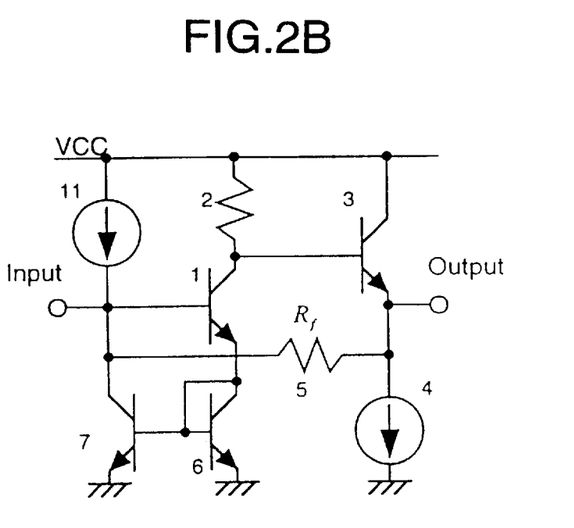

Generally, it is necessary to make a by-pass current flow in the first stage transistor 1. Since the by-pass current is not necessary as a by-pass current of an input signal, such a circuit as shown in FIGS. 2A or 2B is used. FIG. 2A shows a circuit when the by-pass current required to the first stage transistor 1 is supplied from a current source 10. Thus, since the first stage transistor 1 is supplied with a by-pass current by using the current source 10, the by-pass current of the input signal can be canceled and no by-pass current flows in the by-pass transistor 7. Accordingly, only a current component proportional to the current of the input signal can be made to flow only in the current mirror diode 6.

FIG. 2B shows a circuit having a configuration in which an input first stage by-pass current is subtracted from a by-pass current by means of a current source 11 in which the input first stage by-pass current is multiplied by k. Thus, only a current component proportional to an input current $i_{in}$ from which the input first stage by-pass current $i_{by-pass}$ is removed flows in the feedback resistor 5.

Figure 3:
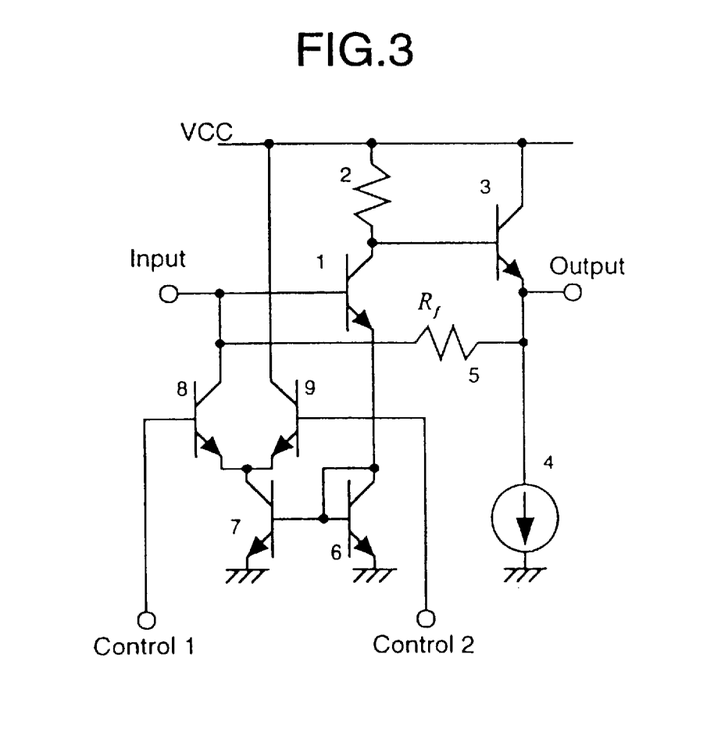
FIG. 3 is a diagram showing a circuit for changing a ratio of a by-pass current to a first stage current.

In order to change a transimpedance, it is necessary to change the ratio between an input signal current and a by-pass current. FIG. 3 shows a circuit configuration for changing the ratio between an input signal current and a by-pass current. The circuit shown in FIG. 3 has a feature in that a current dividing circuit is connected to the collector of the by-pass transistor 7. The current dividing circuit is constituted by current dividing transistors 8 and 9. The emitters of the current dividing transistors 8 and 9 are connected to the collector of the by-pass transistor 7. By controlling the relative values of the respective base voltages of the current dividing transistors 8 and 9, it is possible to change the transimpedance.

In the case where the first stage by-pass current is zero, when the current distribution ratio between the signal current dividing transistor 8 and the dummy current dividing transistor 9 is represented by p, the value of the transimpedance is expressed by the following expression (4):

$$\frac{1}{pk\frac{R_f}{R_L}+1} R_f \qquad (4)$$

Accordingly, by controlling the current distribution ratio p, it is possible to change the transimpedance.

Similarly to FIGS. 2A and 2B, FIGS. 4A and 4B show cases where a by-pass current is made to flow in the first stage transistor 1.

It has been stated above that the current distribution ratio p can be changed by adjusting the base potential difference between the respective base voltages of the current dividing transistors 8 and 9. In each of FIGS. 4A and 4B, in order to adjust the base potential difference, control terminals CONTROL 1 and CONTROL 2 are connected to the bases of the current dividing transistors 8 and 9, respectively, and the voltages to be applied to the respective bases are controlled by means of the control terminals CONTROL 1 and CONTROL 2.

Figure 5:
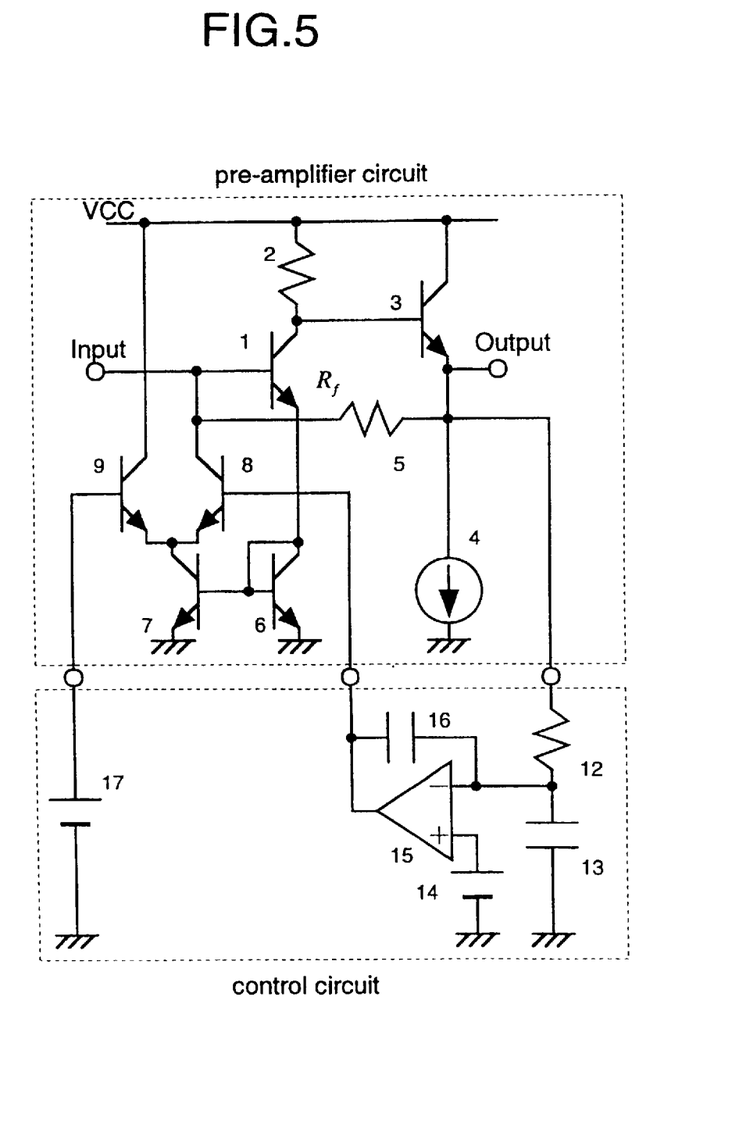
FIG. 5 is a diagram showing a configuration for automatically controlling a ratio of a by-pass current to an input current.

FIG. 5 shows a circuit configuration in which the current distribution ratio is automatically adjusted at the time of a large input to thereby make its output amplitude constant. Its output signal is smoothed by a low-pass filter constituted by a resistor 12 and an integration capacitor 13 and an average output potential is detected. The detected potential is compared with a reference potential 14 and a difference between the two potentials is integrated by means of an integrator constituted by an error amplifier 15 and an integration capacitor 16. The output of the integrator is connected to the base of the dummy current dividing transistor 9 and a predetermined potential is applied to the base of the signal current dividing transistor 8 from a voltage source 17. With such connections, a feedback loop is constituted so that the distribution ratio p between the current dividing transistors 8 and 9 is automatically determined so that the output average potential becomes constant. Since the mark rate of the transmission data is 1/2 in the public data communication network or in the synchronous digital hierarchy, the output amplitude becomes two-times as large as a difference between the base potential of the first stage transistor 1 and the reference potential 14 on the assumption that the mark rate is 1/2. Accordingly, it will do to set the reference potential 14 to a value lower by ½ of a required output amplitude than the base potential of the input transistor 1. When the input current amplitude is small, the signal current dividing transistor 8 turns off so that all the input signal current flows in the feedback resistor 5 and the pre-amplifier operates as an ordinary high-transfer-impedance low-noise pre-amplifier.

Figure 4A:
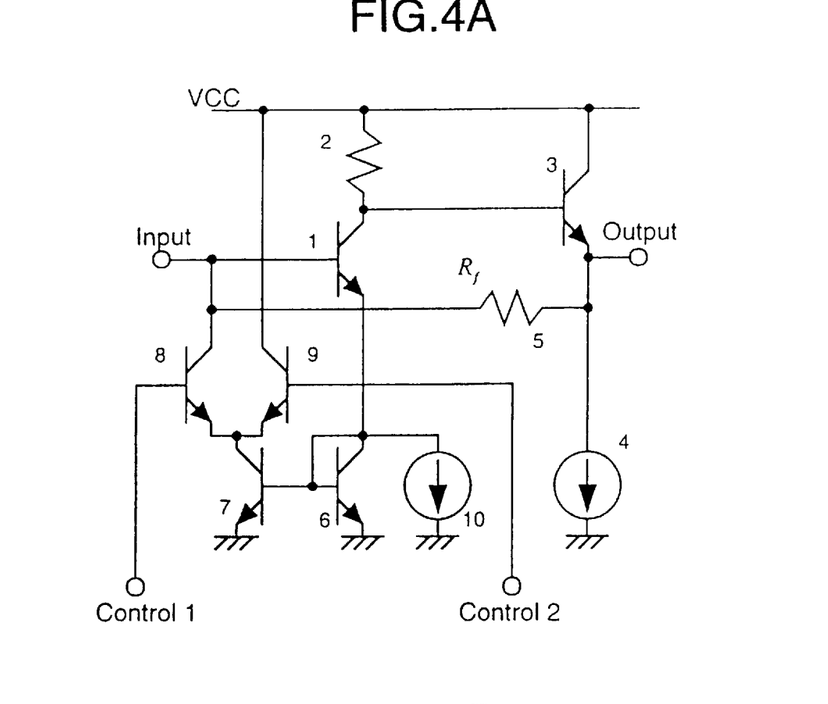
FIGS. 4A and 4B are diagrams showing circuits for changing a ratio of a by-pass current to an input current.
Figure 4B:
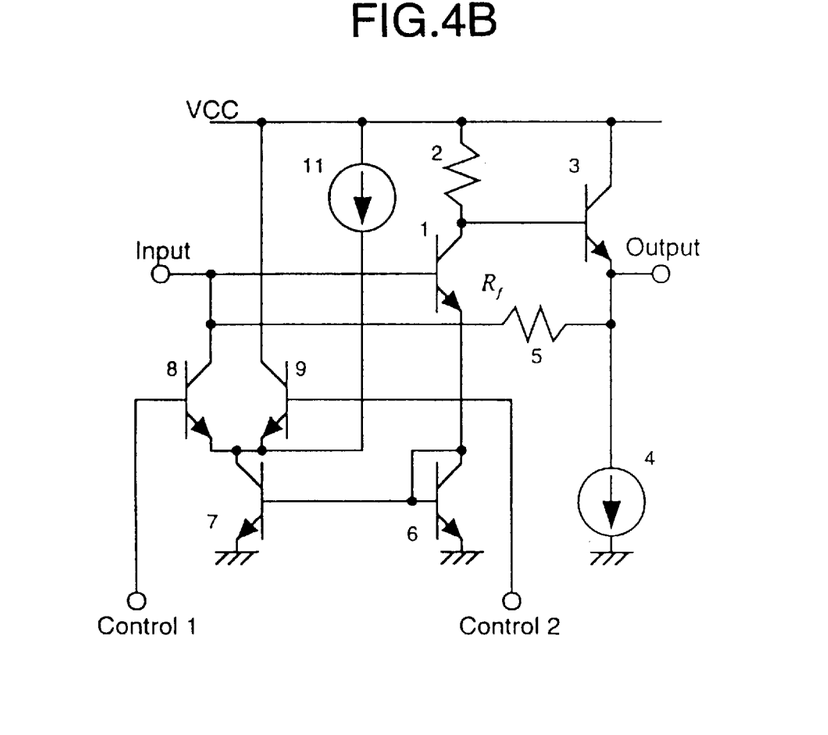

Although FIG. 5 is described on the basis of the circuit of FIG. 3, FIG. 3 may be applied to the circuits of FIGS. 4A and 4B if corresponding control terminals are connected.

Figure 6:
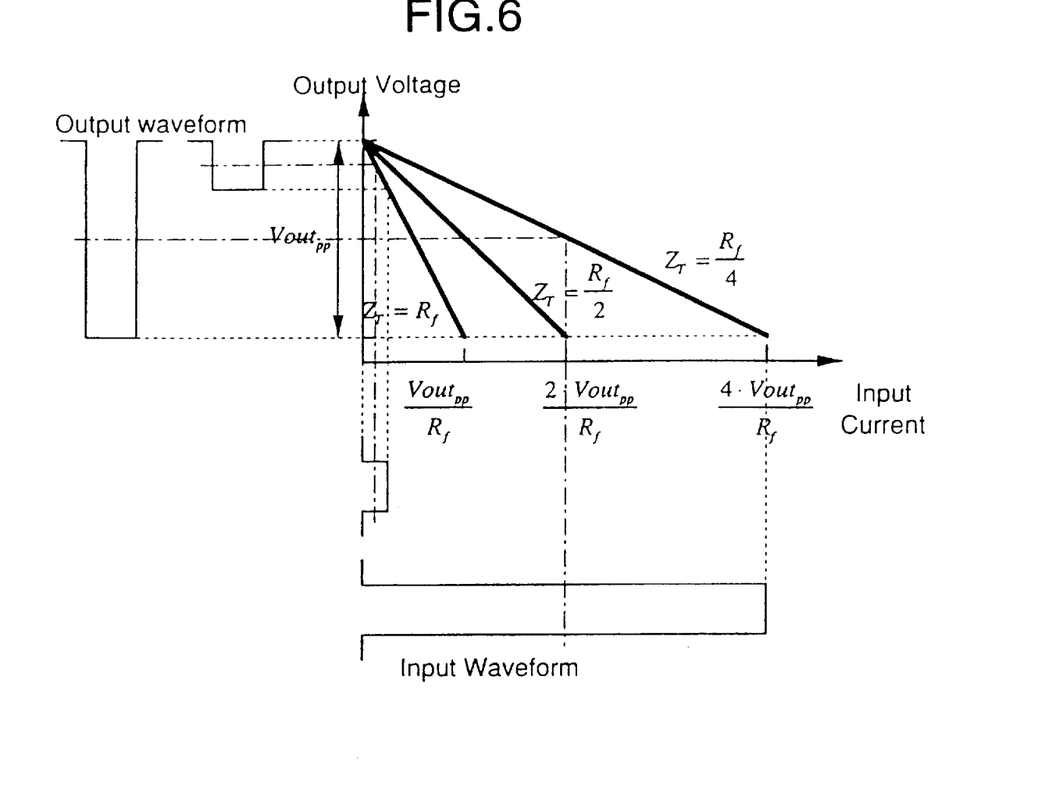
FIG. 6 is a diagram showing an input-output characteristic of a pre-amplifier according to an embodiment of the present invention.

FIG. 6 shows the input-output characteristic according to the present invention. Linear amplification is carried out with a transimpedance of $R_f$ when the input amplitude is small, whereas the input current is by-passed to make the transimpedance low when the input amplitude becomes large. Unlike the conventional circuit, the input current is by-passed proportionally to the input current, and the input-output characteristic is therefore linear. Accordingly, since the potential at the center of the output waveform always corresponds to the current value at the center of the input waveform, the influence of an inter-symbol interference or the like can be suppressed to be smaller.

According to the present invention, since the input signal current of a transimpedance type pre-amplifier can be by-passed proportionally to its instantaneous current value, it is possible to change the transimpedance. When the input signal current is small, the transimpedance is high so that the noise can be made low, whereas when the input signal current is large, the transimpedance is made low so that the saturation in the pre-amplifier can be prevented. Accordingly, the maximum input current of the pre-amplifier can be made large so that the dynamic range can be made large while keeping the sensitivity high as it is. Thus, this pre-amplifier can be widely applied to both short range and long range transmission schemes.

What is claimed is:

1. A pre-amplifier comprising:

input means for receiving a current signal;

amplifying means including a transistor for amplifying the received current signal;

a control current source connected to said input means for by-passing the received current signal;

current detecting means connected as a component of said amplifying means; and a resistor component arranged in a feedback connection between said input means and an output portion, wherein said current detecting means is arranged to effect control of said control current source.

2. A pre-amplifier according to claim 1, wherein said current detecting means includes a diode connected in series to an emitter of said transistor, and wherein said control current source and said diode constitute a current mirror circuit.

3. A pre-amplifier according to claim 2, wherein said transistor in said amplifying means and said control current source are constituted by bipolar transistors.

4. A pre-amplifier according to claim 1 or 2, further comprising another current source connected to said current detecting means in parallel thereto.

5. A pre-amplifier according to claim 1, further comprising a another current source arranged between said input means and a voltage supply connection.

6. A pre-amplifier comprising:

input means for receiving a current signal;

amplifying means including at least one transistor for amplifying the received current signal;

current detecting means connected as a component of said amplifying means;

a resistor component arranged in a feedback connection between said input means and an output portion;

a control current source electrically connected to said input means, said control current source being controlled by said current detecting means; and a current dividing circuit connected to said control current source, at least one output of said current dividing circuit being connected to an input of said pre-amplifier.

7. A pre-amplifier according to claim 6, wherein said at least one transistor in said amplifying means, said control current source and said current dividing circuit are constituted by bipolar transistors.

8. A pre-amplifier comprising:

input means for receiving a current signal;

amplifying means including at lest one transistor for amplifying the received current signal;

current detecting means connected as a component of said amplifying means;

a resistor component arranged in a feedback connection between said input means and an output portion;

a control current source electrically connected to said input means, said control current source being controlled by said current detecting means;

a current dividing circuit connected to said control current source, at least one output of said current dividing circuit being connected to an input of said pre-amplifier; and detecting means which detects an average output voltage of said pre-amplifier, wherein said current dividing circuit is arranged to be responsive to an average output voltage of said pre-amplifier in a manner which maintains a difference between the detected average output voltage and a reference potential at a predetermined value.

9. A pre-amplifier according to claim 8, wherein said at least one transistor in said amplifying means, said control current source and said current dividing circuit are constituted by bipolar transistors.

10. An optical receiver comprising control means connected to a pre-amplifier for controlling a current distribution ratio of said pre-amplifier in correspondence to power of an optical signal inputted to said pre-amplifier, wherein said pre-amplifier comprises:

input means for receiving a current signal;

amplifying means including at least one transistor for amplifying the received current signal;

current detecting means connected as a component of said amplifying means;

a resistor component arranged in a feedback connection between said input means and an output portion of said pre-amplifier;

a control current source coupled to said input means, said control current source being controlled by said current detecting means; and a current dividing circuit connected to said control current source, at least one output of said current dividing circuit being connected to an input of said pre-amplifier.

11. An optical receiver according to claim 10, wherein in said pre-amplifier said at least one transistor in said amplifying means, said control current source and said current dividing circuit are constituted by bipolar transistors.

12. A pre-amplifier comprising:

input means for receiving a current signal;

amplifying means including at least one transistor for amplifying the received current signal;

current detecting means connected as a component of said amplifying means;

a resistor component arranged in a feedback connection between said input means and an output of said pre-amplifier;

a control current source electrically connected to said input means, said control current source being controlled by said current detecting means;

a current dividing circuit connected to said control current source, at least one output of said current dividing circuit being connected to an input of said pre-amplifier;

a low-pass filter which receives output signals of said pre-amplifier and effects an averaging thereof by the low-pass filter action; and an integrator which compares detection of the average output potentials, at an output of said low-pass filter, with a reference potential, wherein said current dividing circuit is controlled in accordance with an average output voltage of said pre-amplifier.

13. A pre-amplifier according to claim 12, wherein said integrator includes a difference amplifier and an integrating capacitor, the integrating capacitor coupling an output of the difference amplifier to one of a pair of inputs thereof, the other one of the pair of inputs of said difference amplifier being applied with said reference potential, and wherein said current dividing circuit includes a dual transistor emitter-coupled arrangement in which a first transistor thereof has main terminals electrically connected between said input means and said control current source and a control terminal electrically connected to the output of said integrator, and in which a second transistor thereof has main terminals electrically connected between an operating potential terminal of said pre-amplifier and said control current source and a control terminal applied with a voltage of a predetermined potential.

14. A pre-amplifier according to claim 12, wherein said at least one transistor in said amplifying means, said control current source and said current dividing circuit are constituted by bipolar transistors.

15. A pre-amplifier comprising:

an input for receiving a current signal and an output for providing an output signal;

an amplifying circuit including a transistor having a control terminal supplied with the current signal received at said input;

a control current source electrically connected to said input means for by-passing the received current signal;

a current detector arranged as a component of said amplifying circuit; and a resistor component arranged in a feedback connection between the input and output of said pre-amplifier, wherein said current detector is arranged to effect control of said control current source.

16. An optical receiver comprising control means connected to a pre-amplifier for controlling a current distribution ratio of said pre-amplifier in correspondence to power of an optical signal inputted to said pre-amplifier, wherein said pre-amplifier comprises:

an input for receiving a current signal and an output for providing an output signal;

an amplifier circuit including at least one transistor for amplifying the received current signal;

a current detector arranged as a component of said amplifier circuit;

a resistor component arranged in a feedback connection between the input and output of said pre-amplifier;

a control current source coupled to said input, said control current source being controlled by said current detector; and a current dividing circuit connected to said control current source, at least one output of said current dividing circuit being connected to an input of said pre-amplifier.

* * * * *